United States Patent [19]

Kuo et al.

[11] Patent Number: 5,339,454
[45] Date of Patent: Aug. 16, 1994

[54] AUTOMATIC GAIN CONTROL FOR RF AMPLIFIER

[75] Inventors: Yao H. Kuo, Canton; John F. Kennedy, Garden City, both of Mich.

[73] Assignee: Ford Motor Company, Dearborn, Mich.

[21] Appl. No.: 740,242

[22] Filed: Aug. 5, 1991

[51] Int. Cl.⁵ .................. H04B 1/10; H04B 1/26
[52] U.S. Cl. .................. 455/247.1; 455/254; 455/266; 455/307
[58] Field of Search .............. 455/276, 295, 266, 254, 455/243.1, 234.1, 234.2, 245.1, 247.1, 246.1, 302, 307, 303; 375/98

[56] References Cited

U.S. PATENT DOCUMENTS

| | | | |
|---|---|---|---|
| 3,947,771 | 3/1976 | Mathews et al. | 325/404 |
| 4,388,731 | 6/1983 | King | 455/303 |
| 4,776,040 | 10/1988 | Ichikawa et al. | 455/315 |
| 5,001,776 | 3/1991 | Clark | 455/234.1 |

FOREIGN PATENT DOCUMENTS

| | | | |
|---|---|---|---|
| 0140337 | 11/1980 | Japan | 455/295 |
| 0160731 | 8/1985 | Japan | 455/295 |
| 0125715 | 6/1987 | Japan | 455/295 |

OTHER PUBLICATIONS

Sanyo Data Sheet for LA1170 FM Front End Circuit pp. 122–132.

*Primary Examiner*—Edward F. Urban
*Assistant Examiner*—Mark D. Wisler
*Attorney, Agent, or Firm*—Mark Mollon; Roger L. May

[57] ABSTRACT

A radio receiver simultaneously achieves maximum sensitivity and minimum susceptibility to intermodulation distortion by employing wideband and narrowband automatic gain control which further selects the automatic gain control response in dependence on the detection of intermodulation distortion. An AGC signal is modified to improve sensitivity in the event of a low narrowband signal level except when intermodulation distortion is detected above a predetermined distortion level.

8 Claims, 4 Drawing Sheets

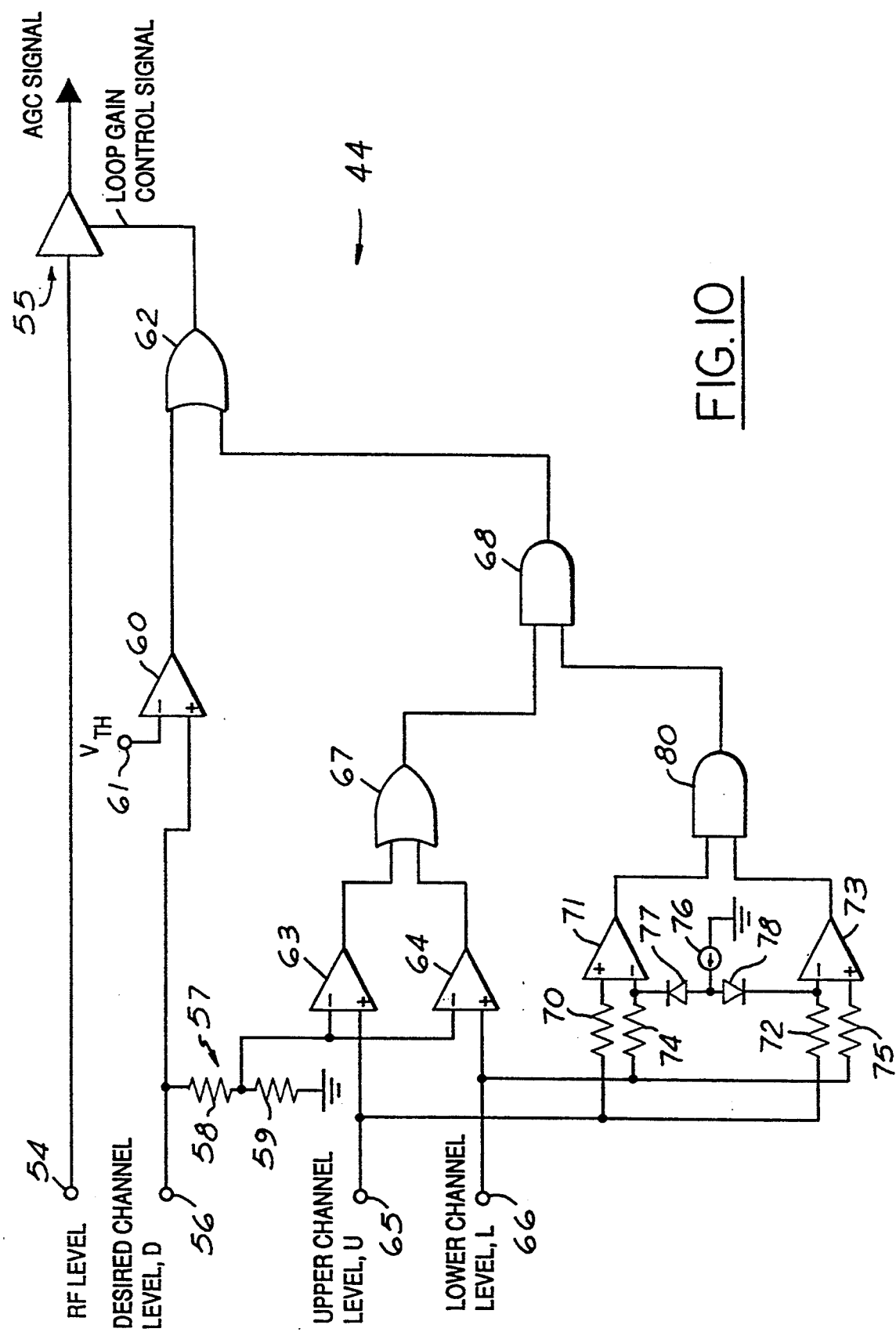

AUTOMATIC GAIN CONTROL FOR RF AMPLIFIER

This application is related to commonly assigned U.S. Pat. Nos. 5,307,515, issued Mar. 26, 1994 and U.S. Pat. No. 5,222,255, issued Jun. 22, 1993 are incorporated by reference.

BACKGROUND OF THE INVENTION

The present invention relates in general to providing automatic gain control for an RF amplifier in a radio receiver, and more specifically to providing automatic gain control for an RF amplifier without desensitizing the receiver to the desired radio signal and while minimizing effects of intermodulation distortion.

Automatic gain control is a well-known technique for maintaining a substantially constant level of an amplified output signal even though the input signal level is varying. In broadcast communication receivers, automatic gain control (AGC) is employed to provide a consistent audio output level despite fluctuations in signal strength of a tuned-in broadcast signal or fluctuations occurring while retuning to other broadcast signals.

Communication receivers typically include many stages of amplification. In superheterodyne receivers, amplification is required for various frequency ranges including an RF amplification stage and an IF amplification stage. The RF amplifier stage typically has a large bandwidth of amplified frequencies while the IF amplifier has a relatively narrow bandwidth.

An AGC circuit controls the gain of the RF amplifier stage in inverse proportion to a measured signal level downstream in the receiver. The measured signal level can correspond to a wideband signal level resulting from the RF amplifier stage, from a narrowband signal level resulting in the IF amplifier stage or the detector, or a combination of both. Use of only the narrowband signal level can result in saturation of the mixer following the RF amplifier stage where strong RF signals are present at frequencies other than the frequency of the desired received signal. Use of only the wideband signal level during those same conditions results in desensitizing the receiver to the desired signal which becomes greatly attenuated.

Systems known as keyed AGC systems control the RF amplifier gain according to both the wideband and narrowband signal levels. The RF gain is controlled in accordance with the wideband signal level unless the narrowband signal level becomes too small (i.e., the receiver is becoming desensitized). In that case, the RF gain is increased (i.e., the AGC signal is reduced) to restore the narrowband signal to a usable level.

Keyed AGC systems have the disadvantage that intermodulation distortion is not removed to the same extent that it is in AGC systems employing only wideband control.

SUMMARY OF THE INVENTION

It is a principal object of the present invention to provide automatic gain control apparatus for controlling RF amplification of radio signals with improved sensitivity without increasing susceptibility to intermodulation distortion.

It is another object of the present invention to provide method and apparatus for implementing simultaneous wideband and narrowband automatic gain control.

It is a further object of the present invention to detect the presence of intermodulation distortion and to modify AGC action in accordance with the detection of intermodulation distortion.

The present invention controls an RF amplifier of radio signals using automatic gain control apparatus which comprises a wideband control loop, a narrowband control loop, and intermodulation detector means. The wideband control loop means generates an AGC signal according to an AGC loop gain (i.e., maintains a relatively constant RF level). The intermodulation detector means detects the presence of intermodulation distortion above a predetermined distortion. The narrowband control means is connected to the wideband control means and to the intermodulation detector and modifies the loop gain in the wideband control loop means when signal strength of a desired radio signal is below a predetermined strength, but not when the intermodulation detector detects intermodulation distortion above the predetermined distortion. That is, the AGC function provided by the wideband control loop is not modified (i.e., operation similar to the keyed AGC system is suspended) when intermodulation distortion is present above the predetermined distortion.

In one preferred embodiment, the wideband control loop means generates the AGC control signal in response to a wideband signal level amplified by selectable first and second loop gains. The narrowband control loop means causes selection of the first loop gain when (i) narrowband signal level is above a predetermined threshold, or (ii) the narrowband signal level is below the predetermined threshold and the intermodulation distortion is above the predetermined distortion, and causes selection of the second loop gain when the narrowband signal level is below the predetermined threshold and the intermodulation distortion is below the predetermined distortion.

BRIEF DESCRIPTION OF THE DRAWINGS

The novel features of the invention are set forth with particularity in the appended claims. The invention itself, however, both as to its organization and method of operation, together with further objects and advantages thereof, may best be understood by reference to the following description taken in conjunction with the accompanying drawings, in which:

FIG. 10 is a schematic diagram showing the AGC control circuit of FIG. 7 in greater detail.

DETAILED DESCRIPTION OF PREFERRED EMBODIMENTS

Figure 1:
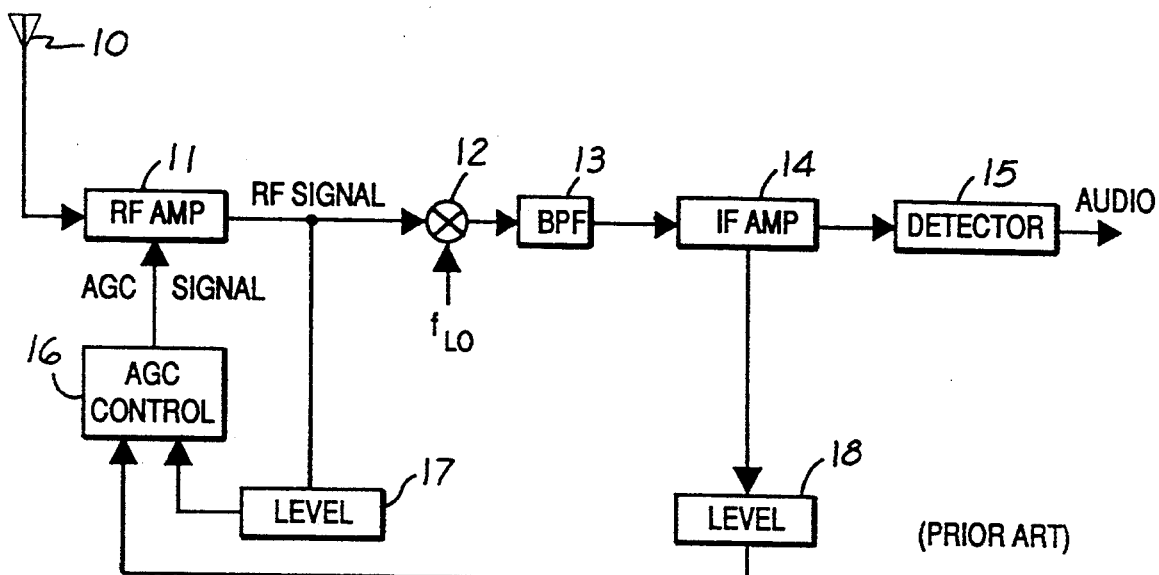
FIG. 1 is a block diagram showing a radio receiver according to the prior art.

In FIG. 1, a conventional receiver includes an antenna 10 connected to a radio frequency (RF) amplifier 11. An RF signal output from RF amplifier 11 is mixed in a mixer 12 with a mixing signal $f_{LO}$ from a local oscillator (not shown). The frequency of mixing signal $f_{LO}$ is selected to frequency-shift a desired RF signal output from RF amplifier 11 to the intermediate frequency (IF) of the receiver. The IF signal from mixer 12 is coupled to a bandpass filter 13, an IF amplifier 14, and a detector 15 to demodulate the audio signal and thereby produce an audio output.

RF amplifier 11 provides a controllable gain in response to an AGC signal from an AGC control circuit 16. AGC control 16 is connected to an RF wideband level detector 17 and an IF narrowband level detector 18.

Figure 2:
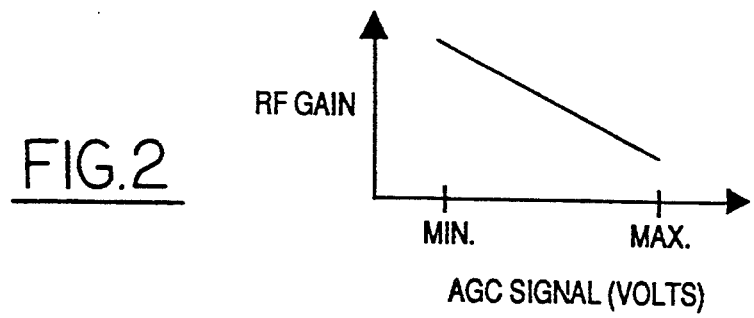
FIG. 2 shows the level of RF gain as controlled by the AGC signal.

As shown in FIG. 2, AGC control 16 generates an AGC signal in inverse proportion to the desired RF gain of the RF amplifier 11. The desired RF gain depends on the outputs of level detectors 17 and 18. To ensure that mixer 12 is not saturated by the RF signal, level detector 17 provides a predetermined limiting magnitude. Since wideband level detector 17 responds to all frequencies being amplified by RF amplifier 11 (i.e., not just the desired signal to which the superheterodyne receiver is tuned to produce an audio output), desensitization to the desired signal can occur as a result of wideband limiting.

Figure 3:
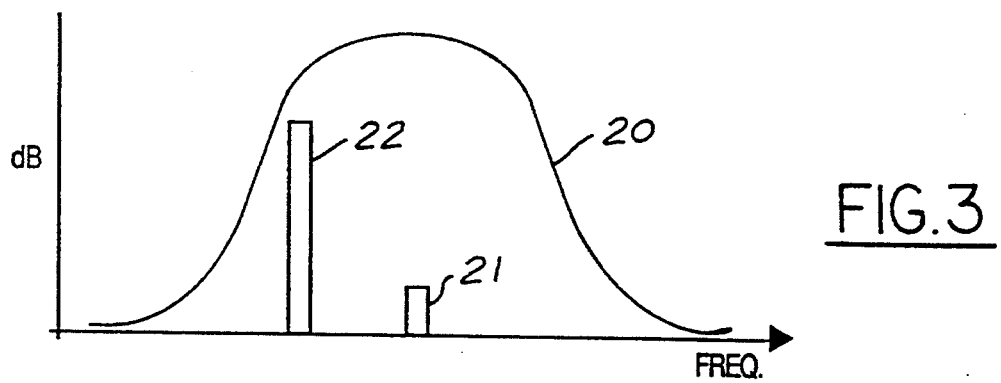
FIG. 3 plots the frequency response of an RF amplifier and relative strengths of two receivable broadcast signals within the RF passband.

In FIG. 3, a curve 20 shows the gain versus frequency characteristic for RF amplifier 11. A desired RF broadcast signal 21 has a relatively smaller signal strength (as measured at the receiver input) than another RF broadcast signal 22. If the strong signal strength of signal 22 causes an increase in the AGC signal (and consequently a reduction in the gain of RF amplifier 11), desired signal 21 can potentially be reduced in level to a point where it is degraded by noise and distortion.

Therefore, the prior art system of FIG. 1 includes narrowband level detector 18 for determining whether the level of the desired signal has fallen below an acceptable minimum. In that event, AGC control 16 reduces the AGC signal to increase RF amplification thereby avoiding desensitization to the desired signal.

Figure 4:
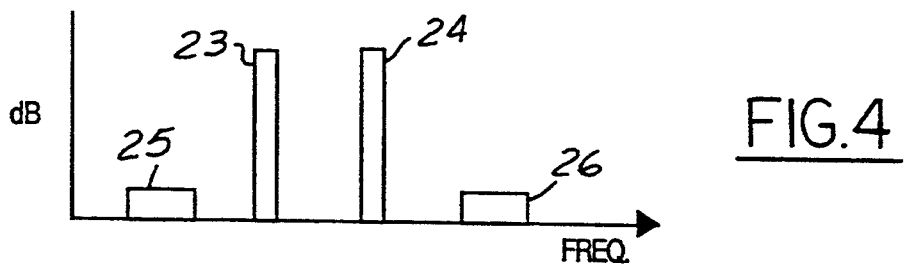
FIG. 4 shows signal strength of two broadcast stations and the intermodulation products which can result in a receiver.
Figure 5:
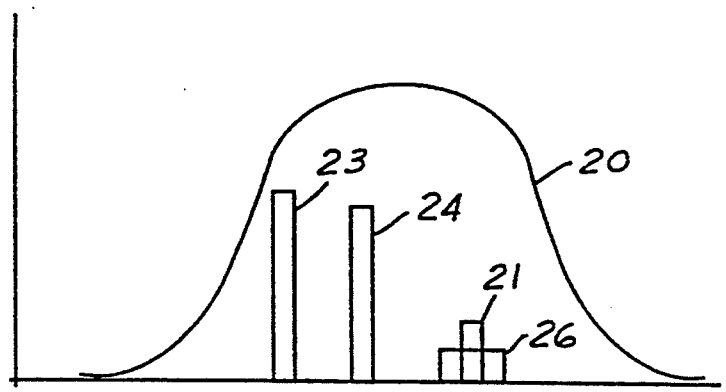
FIG. 5 illustrates the production by two broadcast signals of intermodulation distortion coinciding with a third broadcast signal.

A further problem encountered in radio reception is known as intermodulation distortion. As shown in FIG. 4, a pair of broadcast signals 23 and 24 close in frequency and large in signal strength are present in the received RF band. When two such signals are applied to any nonlinear device (e.g., RF amplifier 11), mixing of the signals occurs giving rise to intermodulation distortion signals 25 and 26 at the sum and difference frequencies of original signals 23 and 24. As shown in FIG. 5, it is possible that the intermodulation distortion signal 26 created by signals 23 and 24 includes frequencies spanning desired RF signal 21.

Figure 6:
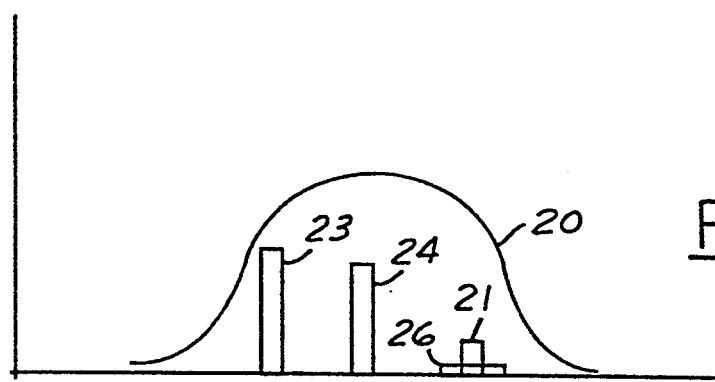
FIG. 6 illustrates the reduction of intermodulation distortion achieved by limiting the gain of the RF amplifier.

Since signals 25 and 26 are the product of the mixing of signals 23 and 24, any decrease in the signal strength of original signals 23 and 24 results in a proportionally greater decrease in intermodulation signals 25 and 26. Therefore, wideband limiting of the RF amplifier signal has a corresponding impact on the amount of intermodulation distortion which might affect a desired signal. As shown in FIG. 6, when RF gain 20 is reduced, the strong signals 23 and 24 are reduced in level and the resulting intermodulation signal 26 has been decreased to a much lower level. A problem arises in the prior art receiver of FIG. 1 since the narrow-band level detector may prevent the reduction of gain in the RF amplifier if the desired signal level 21 is too low. Therefore, intermodulation distortion is not reduced if the desired signal is weak and the intermodulation distortion can easily overwhelm the desired signal. Thus, the steps taken in the prior art to reduce receiver desensitization to weak desired signals has resulted in increased susceptibility to intermodulation distortion problems.

Figure 7:
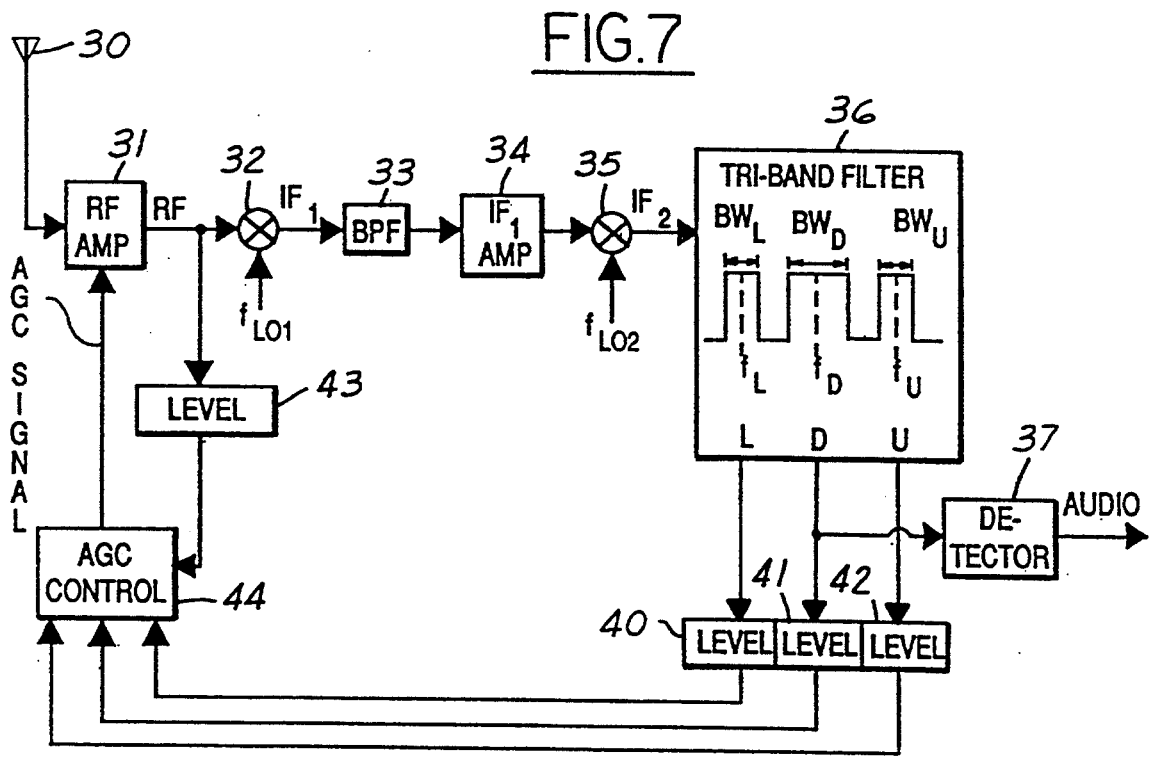
FIG. 7 is a block diagram of a radio receiver constructed according to the present invention.

The foregoing problems are remedied in the receiver of FIG. 7. A receiving antenna 30 is connected to an RF amplifier 31 for providing an RF signal to a mixer 32. A variable local oscillator signal $f_{LO1}$ from a local oscillator (not shown) is provided to mixer 32 so that a first intermediate frequency signal $IF_1$ is generated and is input to a bandpass filter 33. A first IF amplifier 34 amplifies the bandpass filtered signal and provides the amplified IF signal to a second mixer 35. A second local oscillator signal at a fixed frequency $f_{LO2}$ is provided to mixer 35 and a second intermediate frequency $IF_2$ is generated at a frequency lower than $IF_1$. A tri-band filter 36 receives the second intermediate frequency signal $IF_2$ and generates a desired channel signal D, a lower channel signal L, and an upper channel signal U. Desired channel signal D is provided to an audio signal detector 37 and a level detector 41. Lower channel signal L and upper channel signal U are provided to level detectors 40 and 42, respectively. The outputs of level detectors 40–42 are connected to an AGC control circuit 44. A level detector 43 receives the RF signal from RF amplifier 31 and provides an RF level signal to AGC control 44. An AGC signal generated by AGC control 44 is provided to RF amplifier 31.

The receiver shown in FIG. 7 is known as a double frequency conversion superheterodyne receiver. A first intermediate frequency $IF_1$ is preferably located at about 10.7 MHz in order to provide image rejection as is known in the art. A second intermediate frequency $IF_2$ is selected at about 2MHz or less, whereby a tri-band filter 36 can be constructed with inexpensive components to provide the separate passbands employed by the present invention. Furthermore, the bandwidths of bandpass filter 33 and IF amplifier 34 are sufficiently large to include adjacent channel signals on either side of the desired signal.

A center passband of tri-band filter 36 corresponds to a desired signal $f_D$ (located at the second intermediate frequency $IF_2$ after mixing) and has a bandwidth $BW_D$ of about 150 kHz for an FM receiver so as to include all the desired channel signals. A lower channel adjacent signal is isolated by a lower passband centered on a lower adjacent channel frequency $f_L$ having a bandwidth $BW_L$ of from about 5 kHz to about 20 kHz. Frequency $f_L$ can be located anywhere in the frequency range of the lower adjacent channel, not necessarily at the center frequency of the adjacent channel. In a preferred embodiment, $f_L$ may be about 112 kHz less than $f_d$. An upper adjacent channel passband having a center frequency $f_U$ and a bandwidth $BW_U$ is located symmetrically about frequency $f_D$ with the lower adjacent channel passband.

The tri-band filter output is comprised of a desired channel signal D, a lower channel signal L, and an upper channel signal U. Level detectors 40-42 determine the peak signal strength level of each tri-band filter output and provide the level information to AGC control 44. Since the lower passband and the upper passband of the tri-band filter have identical bandwidths, the detected levels for these channels is employed in the present invention to detect the presence of intermodulation distortion. Thus, in the absence of intermodulation distortion, the AGC signal is determined according to wideband RF level and narrowband IF level as in prior receivers. However, at the onset of intermodulation distortion, RF gain of the RF amplifier is allowed to be reduced even with the presence of a weak narrowband level in order to prevent intermodulation distortion.

Figure 8:
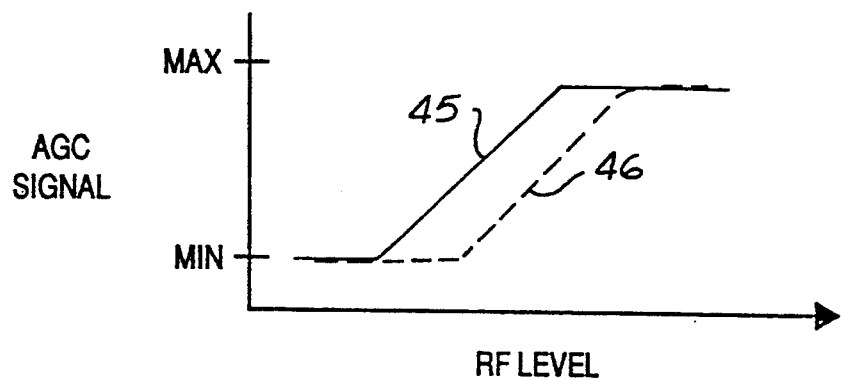
FIG. 8 shows first and second AGC signal curves generated according to different loop gain characteristics.

In one preferred embodiment of the invention, AGC control circuit 44 comprises a curve generator having the wideband RF level signal as an input to the curve generator whereby the AGC signal is proportional to the RF level. As shown in FIG. 8, the AGC curve generator employs either a first gain characteristic 45 or a second gain characteristic 46 depending on the inputs from level detectors 40-42. Gain characteristic 45 corresponds to normal wideband operation wherein full suppression of intermodulation distortion is achieved. Gain characteristic 46 corresponds to a reduction in the AGC signal at a corresponding RF level when the detected narrowband level is weak.

Gain characteristic 45 will be referred to as an unmodified AGC signal and corresponds to a maximum AGC loop gain. Gain characteristic 46 is referred to as a modified AGC signal and corresponds to a minimum AGC loop gain.

Figure 9:
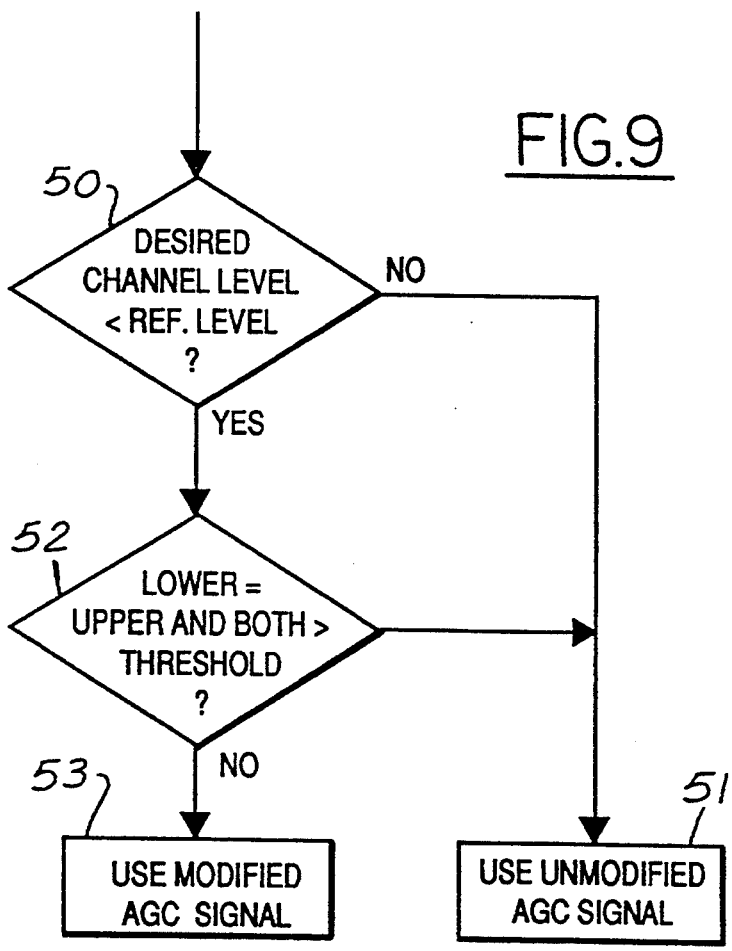
FIG. 9 is a flowchart illustrating selection between different loop gain characteristics.

The AGC control circuit selects the modified or unmodified AGC signal employing the method illustrated in the flowchart of FIG. 9. In step 50, the desired channel level is compared to a predetermined reference level below which the desired channel level is considered to be sufficiently weak that further suppression of RF gain by the AGC signal would be undesirable. If the desired channel level is not below the reference level, then the unmodified AGC signal is used in step 51. In other words, the maximum AGC loop gain is employed for the RF amplifier output in the event that the desired signal has a level above the reference level.

If the desired channel level is less than the reference level in step 50, then a test is made in step 52 for determining the presence of intermodulation distortion. If the upper and lower channel levels are substantially equal and are both above a noise threshold level, then intermodulation distortion is present and the unmodified AGC signal is used in step 51. However, if intermodulation distortion is not present (i.e., the lower and upper channel levels are not substantially equal or they are less than the noise threshold) then the modified AGC signal (i.e., minimum AGC loop gain) is used in step 53. Accordingly, one of two selectable gain curve characteristics is selected for generating the AGC signal in response to the RF level using the receiver of FIG. 7.

AGC control circuit 44 is shown in greater detail in FIG. 10. The RF level signal is input at a terminal 54 and to a curve generating amplifier 55. The desired channel level signal is received at a terminal 56 which is connected to a voltage divider 57 and the non-inverting input of a comparator 60. The inverting input of comparator 60 is connected to a voltage terminal 61 which receives a noise threshold voltage $V_{TH}$. The output of comparator 60 is connected to one input of an OR gate 62 having its output connected as a loop gain control for curve generating amplifier 55.

Voltage divider 57 is comprised of a pair of resistors 58 and 59 connected in series between terminal 56 and circuit ground. The junction of resistors 58 and 59 is connected to the inverting inputs of a comparator 63 and a comparator 64. The noninverting input of comparator 63 is connected to a terminal 65 for receiving the upper channel level signal. The noninverting input of comparator 64 is connected to a terminal 66 for receiving the lower channel level signal. The outputs of comparators 63 and 64 are connected to respective inputs of an OR gate 67. The output of OR gate 67 is connected to one input of an AND gate 68.

Terminal 65 receiving the upper channel level signal is further connected to the noninverting input of a comparator 71 through a resistor 70 and to the inverting input of a comparator 73 through a resistor 72. Terminal 66, receiving the lower channel level signal, is further connected to the inverting input of comparator 71 through a resistor 74 and to the noninverting input of comparator 73 through a resistor 75. The positive terminal of a constant current supply 76 is connected to the anodes of a pair of diodes 77 and 78. The cathode of diode 77 is connected to the inverting input of comparator 71 and the cathode of diode 78 is connected to the inverting input of comparator 73. The outputs of comparators 71 and 73 are connected to respective inputs of a NAND gate 80 having its output connected to the other input of AND gate 68. The output of AND gate 68 is connected to the other input of OR gate 62.

The output of OR gate 62 is either a high or low level logic signal for selecting between first and second loop gains for the wideband control loop which generates an AGC signal in proportion to the detected RF level. For example, a maximum loop gain (e.g., gain characteristic 45 in FIG. 8) is selected when the output of OR gate 62 is at a high logic level and a minimum loop gain (corresponding to gain characteristic 46 in FIG. 8) is selected in response to a low logic level at the output of OR gate 62.

A high logic level output from comparator 60 indicates that the desired signal is being received at a high signal strength. The threshold voltage $V_{TH}$ preferably corresponds to a received field strength at the antenna of the desired broadcast signal of about 50 mV or greater.

If the desired channel level is below the threshold $V_{TH}$, then a low logic level is output from comparator 60, thus allowing the minimum loop gain to be selected unless the other input to OR gate 62 is high. The other input signal to OR gate 62 is high when inter-modulation distortion is detected. Thus, even though the desired channel level may be low, the maximum loop gain continues to be selected to minimize the intermodulation distortion.

According to the present invention, intermodulation distortion is detected when the upper channel level is substantially equal to the lower channel level (with some tolerance) and the upper and lower channel levels are above a predetermined level which ensures that the signal strength detected by the upper and lower channel levels does not correspond to noise and is sufficiently less than the desired level to have an impact on audio output. Thus, comparators 63 and 64 compare the upper and lower channel levels to a portion of the desired channel level provided by voltage divider 57. Voltage divider 57 divides the desired channel level by a factor of from about 20 to about 50 for comparison with the upper and lower channel levels. If either the upper or lower channel level is greater than the threshold, the outputs of at least one of comparators 63 or 64 will be high resulting in a high logic level output from OR gate 67.

Comparators 71 and 73 and NAND gate 80 comprise a window detector for determining whether the upper channel level and the lower channel level are equal, to within a predetermined window. The predetermined window results from constant current source 76 providing a bias current to resistors 74 and 72. The size of the predetermined voltage window is determined by the values of resistors 74 and 72 multiplied by the supplied current. If the upper channel level is equal to the lower channel level to within the predetermined window, then NAND gate 80 provides a high logic level output to AND gate 68. When both conditions are satisfied, AND gate 68 provides a high logic level output signal indicating the presence of intermodulation distortion.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. A method for controlling gain of a radio frequency (RF) amplifier in a radio receiver, said RF amplifier having a controllable gain responsive to an automatic gain control (AGC) signal, said method comprising the steps of:
   amplifying received RF radio signals by said controllable gain in said RF amplifier;
   level detecting a wideband signal resulting from amplified RF radio signals;
   generating said AGC signal in response to wideband signal level such that said controllable gain maintains said detected wideband signal level at less than or equal to a predetermined limit;
   mixing said amplified RF radio signals to derive intermediate frequency (IF) signals;
   tri-band filtering said IF signals to derive a lower channel signal, a desired channel signal, and an upper channel signal;
   level detecting said tri-band filtered IF signals to produce a lower channel level, a desired channel level, and an upper channel level; and
   modifying said AGC signal to provide an increase in said controllable gain if said desired channel level is below a predetermined threshold except when said lower channel level and said upper channel level are equal and are above a predetermined level.

2. The method of claim 1 wherein said predetermined level is proportional to said desired channel level.

3. The method of claim 1 wherein said lower channel signal and said upper channel signal are obtained by passband filtering using a lower passband and an upper passband within the frequency ranges of a lower adjacent channel and an upper adjacent channel, respectively, and having substantially equal bandwidths.

4. The method of claim 1 wherein said mixing step includes a double frequency conversion.

5. A method for controlling gain of a radio frequency (RF) amplifier in a radio receiver, said RF amplifier having a controllable gain responsive to an automatic gain control (AGC) signal, said method comprising the steps of:
   amplifying received RF radio signals by said controllable gain in said RF amplifier;
   level detecting a wideband signal resulting from amplified RF radio signals;
   generating said AGC signal by amplifying said wideband signal level by either a first loop gain or a second loop gain less than said first loop gain;
   mixing said amplified RF radio signals to derive IF signals;
   tri-band filtering said intermediate frequency (IF) signals; to derive a lower channel signal, a desired channel signal, and an upper channel signal;
   level detecting said tri-band filtered IF signals to produce a lower channel level, a desired channel level, and an upper channel level;
   selecting said first loop gain when i) said desired channel level is above a predetermined threshold or ii) said desired channel level is below said predetermined threshold and said upper and lower channel levels are substantially equal and above a predetermined level; and
   selecting said second loop gain when said desired channel level is below said predetermined threshold and said upper and lower channel levels are either unequal or below said predetermined level.

6. Radio receiver apparatus comprising:
   radio frequency (RF) amplifier means having a controllable gain responsive to an automatic gain control (AGC) signal for amplifying received RF radio signals by said controllable gain;
   RF level detecting means coupled to said RF amplifier means for level detecting a wideband signal;
   mixer means coupled to said RF amplifier means for mixing said amplified RF radio signals to derive intermediate frequency (IF) signals;
   tri-band filter means coupled to said mixer means for tri-band filtering said IF signals to derive a lower channel signal, a desired channel signal, and an upper channel signal;
   tri-band level detecting means coupled to said tri-band filter means for level detecting said tri-band filtered IF signals to produce a lower channel level, a desired channel level, and an upper channel level; and
   AGC generator means coupled to said RF amplifier means, said RF level detecting means, and said tri-band level detecting means for generating said AGC signal in response to said wideband signal level whereby said controllable gain maintains said wideband signal level at less than or equal to a predetermined limit, and for modifying said AGC signal to provide an increase in said controllable gain if said desired channel level is below a predetermined threshold except when said lower channel level and said upper channel level are equal and are above a predetermined level.

7. The apparatus of claim 6 wherein said tri-band filter means is comprised of a lower channel passband filter having a passband within the frequency range of a lower adjacent channel and an upper channel passband filter passband having a passband within the frequency range of an upper adjacent channel, said pass-bands having substantially equal bandwidths.

8. The apparatus of claim 6 wherein said mixer means comprises a first mixing stage having an intermediate frequency of about 10 megahertz or higher and a second mixing stage having an intermediate frequency of about 2 megahertz or lower.

* * * * *